(12) United States Patent
Goto

(10) Patent No.: US 7,473,905 B2
(45) Date of Patent: Jan. 6, 2009

(54) ELECTROSTATIC DEFLECTOR

(75) Inventor: Kazuya Goto, Akishima (JP)

(73) Assignee: Jeol Ltd., Tokyo (JP)

( * ) Notice: Subject to any disclaimer, the term of this patent is extended or adjusted under 35 U.S.C. 154(b) by 232 days.

(21) Appl. No.: 11/528,942

(22) Filed: Sep. 28, 2006

(65) Prior Publication Data
US 2007/0075258 A1    Apr. 5, 2007

(30) Foreign Application Priority Data
Oct. 4, 2005    (JP) .............................. 2005-290864

(51) Int. Cl.
G21K 1/08    (2006.01)
H01J 3/14    (2006.01)
H01J 3/26    (2006.01)
H01J 49/42   (2006.01)
A61N 5/00    (2006.01)
G21G 5/00    (2006.01)
B01D 59/44   (2006.01)
H01J 49/28   (2006.01)
H01J 49/00   (2006.01)

(52) U.S. Cl. .................. 250/396 R; 250/294; 250/296; 250/492.3

(58) Field of Classification Search .................. 250/294, 250/296, 396 R, 492.3
See application file for complete search history.

(56) References Cited

U.S. PATENT DOCUMENTS 6,055,719 A     5/2000   Ooaeh et al.
6,642,675 B2 * 11/2003  Ogasawara ............. 250/396 R
7,075,078 B2 *  7/2006  Ose et al. ................ 250/396 R

FOREIGN PATENT DOCUMENTS

JP            57202630        12/1982
JP          359180943 A    * 10/1984
JP             2100250         4/1990

* cited by examiner

Primary Examiner—Jack I Berman
Assistant Examiner—Brooke Purinton
(74) Attorney, Agent, or Firm—The Webb Law Firm

(57) ABSTRACT

There is disclosed an electrostatic deflector having four pillar-like identical electrodes spaced from each other by 90°. An even number of pillar-like electrodes are disposed in each space between the four electrodes. Spaces are formed on both sides of each one of the first electrodes and have bent portions. The even number of electrodes are arranged symmetrically relative to a third or fourth vertical plane including an axis spaced from the X-axis by 45° or −45°, respectively. Holes are formed across each of the third and fourth vertical planes. Rod-like members are inserted in the holes.

4 Claims, 3 Drawing Sheets

ELECTROSTATIC DEFLECTOR

BACKGROUND OF THE INVENTION

1. Field of the Invention

The present invention relates to an electrostatic deflector made up of (4+8m) electrodes (m=1, 2, 3, . . . ).

2. Description of Related Art

In recent years, electron-beam lithography systems have been indispensable for manufacture of semiconductor devices.

FIG. 1 schematically shows one example of such an electron-beam lithography system.

The lithography system has an electron gun 1 emitting an electron beam, a condenser lens 2 for focusing the beam onto a material 4 to be written, a deflector 5 for directing the beam at a position on the material based on data about a pattern delineation position, and a stage-driving mechanism 6 for controlling motion of a sample stage assembly 3 on which the material 4 is placed.

A controller C sends a deflection signal matched to the data about the pattern delineation position to the deflector 5 via a D/A converter 7 and via an amplifier 8. The controller C also sends a stage-moving signal to the stage-driving mechanism 6 via a D/A converter 9.

A blanking mechanism 10 consists of blanking deflectors 11 and blanking plates 12 and blanks the electron beam according to a blanking signal based on data about the pattern delineation time, the data being sent in from the controller C. The beam is emitted from the electron gun 1.

For convenience of illustration, the shown deflector 5 is only one. In practice, the deflector is composed of a deflection element for deflection in the X-direction and a deflection element for deflection in the Y-direction. Similarly, the sample stage assembly 3 consists of a stage for X-motion and a stage for Y-motion.

In the lithography system of the structure described above, when a semiconductor pattern is delineated in practice, the electron beam from the electron gun 1 is focused onto the material 4 to be patterned by the condenser lens 2. At the same time, the deflector 5 scans the beam over a desired location on the material 4 according to the deflection signal based on the data about the pattern position derived from the controller C, thus delineating a desired pattern on the material.

In charged-particle beam equipment, such as electron microscopes and focused-ion beam systems as well as the above-described electron-beam lithography system, deflectors are mounted to deflect the beam.

Such deflectors include electromagnetic deflectors and electrostatic deflectors. The electromagnetic type deflects a charged-particle beam by a magnetic field produced by electrically energizing a coil or electromagnet. The electrostatic type deflects a charged-particle beam by an electric field that is produced by applying a voltage to plural electrodes. In many electron-beam lithography systems, the electrostatic type is used which is capable of high-speed deflection because there is no hysteresis.

FIG. 2 shows a cross section of an electrostatic quadrupole deflector that is a typical electrostatic deflector.

This electrostatic defector has four pillar-like electrodes 21, 22, 23, and 24 which are identical in shape and size. The four electrodes are arranged on the same circumference such that they together form a cylindrical form. Voltages +Vx and −Vx are applied to the electrodes 21 and 22, respectively, which are opposite to each other in the X-direction. Voltages +Vy and −Vy are applied to the electrodes 23 and 24, respectively, which are opposite to each other in the Y-direction. A charged-particle beam that passes down the center axis of the cylindrical deflector is deflected by the electric field. The electric fields produced in the X- and Y-directions are controlled by appropriately adjusting the applied voltages. Consequently, the charged-particle beam is deflected in an appropriate direction.

For convenience of illustration, only deflection in the X-direction is now considered. It is assumed that voltages +Vx and −Vx are applied to the opposite electrodes 21 and 22, respectively, and that the other electrodes are grounded. The deflector itself is assumed to be symmetrical with respect to a vertical plane including the X-axis and a vertical plane including the Y-axis. The potential distribution within the deflector is given by $$V(r, \theta) = Vx \sum_{n=1}^{\infty} A_n r^{2n-1} \cos(2n-1)\theta \quad (1)$$

where r is the distance from the center O of the deflector and θ is the angle measured from the X-axis.

In this equation, $A_n$ is a constant. It is assumed that each electrode is sufficiently long in the Z-direction (in the direction perpendicular to the plane of paper) and that the potential distribution in the Z-direction is uniform.

The description provided so far applies to the potential distribution within the deflector when only deflection in the X-direction is considered. The potential distribution within the deflector when only deflection in the Y-direction is considered can be considered exactly the same.

It can be seen from this equation that the potential distribution within the electrostatic deflector contains higher-order components which cause deflection aberrations. However, it is impossible to cancel out the higher-order components in the electrostatic quadrupole deflector shown in FIG. 2.

FIG. 3 shows a cross section of an electrostatic octopole deflector. This deflector is made up of eight pillar-like electrodes 25, 26, 27, 28, 29, 30, 31, and 32 which are identical in shape and size. The electrodes are arranged on the same circumference such that the electrodes together constitute a cylindrical form. Voltages +Vx and −Vy are applied to the electrodes 25 and 26, respectively, which are opposite to each other in the X-direction. Voltages +Vy and −Vy are applied to the electrodes 27 and 28, respectively, which are opposite to each other in the Y-direction. Voltages (+Vx−Vy)/√2 and (−Vx+Vy)/√2 are applied to the electrodes 29 and 30, respectively, which are opposite to each other in a direction midway between the X- and Y-directions. Similarly, voltages (+Vx+Vy)/√2 and (−Vx−Vy)/√2 are applied to the electrodes 31 and 32, respectively, which are opposite to each other in a direction midway between the X- and Y-directions. Thus, a charged-particle beam passing down the center axis of the cylindrical deflector is deflected by the electric field.

In the electrostatic octopole deflector of this configuration, the term of n=2 of Eq. (1), i.e., $r^3 \cos 3\theta$, can be canceled out. Although components of orders higher than the $r^3 \cos 3\theta$ are not canceled out, such higher-order components can be neglected within a range where the range of deflection is small.

FIG. 4 shows a cross section of an electrostatic deflector consisting of (4+8m) electrodes (m=1, 2, 3, . . . ) (e.g., m=1), i.e., 12 poles.

In this electrostatic deflector, four pillar-like electrodes 33, 34, 35, and 36 which are identical in shape and size and eight pillar-like electrodes 37, 38, 39, 40, 41, 42, 43, and 44 which are identical in shape and size are arranged on the same circumference such that all the electrodes together form a cylindrical form. Alternate electrodes 33, 37, 39, 34, 38, and 40 are X-direction deflection electrodes. A voltage +Vx is applied to the electrodes 33, 37, and 40. A voltage −Vx is applied to the electrodes 34, 38, and 39. The other alternate electrodes 35, 43, 42, 36, 44, and 41 are Y-direction deflection electrodes. A voltage +Vy is applied to the electrodes 35, 43, and 41. A voltage −Vy is applied to the electrodes 36, 44, and 42. The deflector itself is symmetrical with respect to (i) a first vertical plane including the X-axis, (ii) a second vertical plane including the Y-axis, (iii) a third vertical plane including an axis located in an angular position spaced from the X-axis in the positive (+) direction by 45°, and (iv) a fourth vertical plane including an axis located in an angular position spaced from the X-axis in the negative (−) direction by 45°.

In the electrostatic deflector of this construction, the component $r^3 \cos 3\theta$ can be canceled out. Furthermore, the potential components of the orders higher than $r^3 \cos 3\theta$ can be canceled out by increasing the number of electrodes (i.e., by increasing the number m) arranged between the electrodes 33, 34, 35, and 36 (Japanese Patent Publication No. H03-053736). The electrodes 33 and 34 are disposed about the vertical plane including the X-axis. The electrodes 35 and 36 are disposed about the vertical plane including the Y-axis. In this way, it can be said that the electrostatic deflector consisting of (4+8m) electrodes (m=1, 2, 3, . . . ) capable of canceling out higher-order components causing deflection aberrations is a quite advantageous deflector.

In the electrostatic deflector, a gap is formed between every two adjacent ones of the electrodes constituting the deflector, and each electrode is held to a support body made of an insulating material. In this way, the electrodes are supported and insulated from each other. However, where a beam of charged particles leaks to the side of the support body of the insulating material through the gaps between the electrodes and the support body becomes electrically charged, an electric field is produced by charging. This field leaks toward the center of the deflector through the gaps between the electrodes, exerting unwanted deflecting force on the beam of charged particles. As a result, desired deflection is done inaccurately. Accordingly, the following countermeasures have been taken.

In the deflector shown in FIG. 5, the side surfaces of the electrodes are formed in such a way that the gaps 53a, 53b, 53c, and 53d between the four electrodes 52a, 52b, 52c, and 52d are bent, the four electrodes being held to an electrode support body 51 made of an insulating material, thus preventing the beam of charged particles from leaking to the insulative electrode support body 51 through the gaps between the electrodes. In this way, the support body 51 is prevented from being electrically charged. Furthermore, if the support body 51 is electrically charged for some cause and an electric field is produced, the field is prevented from leaking toward the center of the deflector. For convenience of illustration, the electrostatic quadrupole deflector shown in FIG. 5 is equipped with antistatic means. An electrostatic deflector consisting of (4+8m) electrodes (m=1, 2, 3, . . . ) as shown in FIG. 4 can be similarly antistatically designed.

However, the processing providing such bent portions destroys the symmetry of the electrostatic deflector itself. Therefore, higher-order components of the potential cannot be removed in the electrostatic deflector consisting of (4+8m) electrodes (m=1, 2, 3, . . . ).

In the deflector shown in FIG. 6, the gaps 57a, 57b, 57c, and 57d between the four electrodes 55a, 55b, 55c, and 55d held to the electrode support body 54 made of an insulating material are partially widened. That is, holes are formed in the electrodes across the boundaries between the electrodes. Rod-like members 56a, 56b, 56c, and 56d, each made of a conductive material having a diameter greater than the width of each original gap, are inserted in the widened portions. The beam of charged particles is prevented from leaking to the insulative electrode support body 54 through the interelectrode gaps, thus preventing the support body 54 from being charged. If the support body 54 should be electrically charged for some cause, the electric field produced by the charging would be prevented from leaking toward the center of the deflector. In this way, holes are formed across the boundaries between the electrodes and extend the same distance into each of the electrodes, and the rod-like members are inserted in the holes. Because of this simple structure, the symmetry of the electrostatic deflector itself is maintained. If this antistatic measure is applied to the electrostatic deflector consisting of (4+8m) electrodes (m=1, 2, 3, . . . ), higher-order components are prevented from being lost.

However, where the number of poles is small as in the electrostatic quadrupole deflector shown in FIG. 6, there are no problems. If such antistatic measure is taken for the electrostatic deflector consisting of (4+8m) electrodes (m=1, 2, 3, . . . ), 12 holes each having a diameter larger than the interelectrode spacing must be formed even in the simplest case where m=1. The circumferential thickness of each electrode must be increased considerably. Therefore, the whole electrostatic deflector is increased greatly in size. If the deflector is increased in size in this way, the charged-particle beam system equipped with such a deflector is increased in size. In addition, the range of usage of the deflector is limited severely. For instance, there is a danger that the deflector cannot be used in an in-lens design having an objective lens equipped with a built-in deflector to reduce the working distance.

SUMMARY OF THE INVENTION

The present invention has been made to solve the problem described above. It is an object of the invention to provide a novel electrostatic deflector.

The present invention provides an electrostatic deflector having (4+8m) pillar-like electrodes (m=1, 2, 3, . . . ) including two pillar-like first electrodes disposed opposite to a first vertical plane including an X-axis, two pillar-like second electrodes disposed opposite to a second vertical plane including a Y-axis, and 8m third pillar-like electrodes arranged such that an even number of third electrodes are arranged in each one space between adjacent ones of the four electrodes of the first and second electrodes. The first, second, and third electrodes together form a cylindrical form and are arranged on the same circumference with gaps between the electrodes. The first, second, and third electrodes are held to a cylindrical support body made of an insulating material. The first and second electrodes are identical in shape and size. The third electrodes are identical in shape and size and are disposed between the four electrodes consisting of the first and second electrodes. Alternate ones of the electrodes act as X-direction deflection electrodes. The remaining electrodes act as Y-direction deflection electrodes. Gaps on both sides of each one of the first electrodes have bent portions which are symmetrical with respect to the first vertical plane including the X-axis. Gaps on both sides of each one of the second electrodes have bent portions which are symmetrical with respect to the second vertical plane including the Y-axis. Some of the third electrodes are arranged symmetrically with respect to a third vertical plane including an axis located at an angular position angularly spaced from the X-axis by +45°. The remaining ones of the third electrodes are arranged symmetrically with respect to a fourth vertical plane including an axis located at an angular position angularly spaced from the X-axis by −45°. Holes are formed across each of the third and fourth vertical planes and extend the same distance into each of two electrodes adjacent to the vertical plane. Rod-like members are disposed in the holes such that the rod-like members are not in contact with the electrodes. The deflector itself consisting of the electrodes, gaps, rod-like members, and support body is formed symmetrically with respect to (i) the first vertical plane including the X-axis, (ii) the second vertical plane including the Y-axis, (iii) the third plane including the axis angularly spaced from the X-axis by +45°, and (iv) the fourth vertical plane including the axis angularly spaced from the X-axis by −45°.

The electrostatic deflector according to the present invention consists of the electrodes, gaps, rod-like members, and support body, and is formed symmetrically with respect to (i) the first vertical plane including the X-axis, (ii) the second vertical plane including the Y-axis, (iii) the third vertical plane including the axis angularly spaced from the X-axis by +45°, and (iv) the fourth vertical plane including the axis angularly spaced from the X-axis by −45°. The holes are formed in some of the interelectrode gaps and extend into the electrodes on both sides of each such interelectrode gap. The rod-like members are mounted in only four ones of the (4+8m) interelectrode gaps. Consequently, higher-order components which would normally produce deflection aberrations can be removed without increasing the size of the deflector itself.

Other objects and features of the invention will appear in the course of the description thereof, which follows.

DESCRIPTION OF THE PREFERRED EMBODIMENTS

Embodiments of the present invention are hereinafter described in detail with reference to the accompanying drawings.

Figure 1:
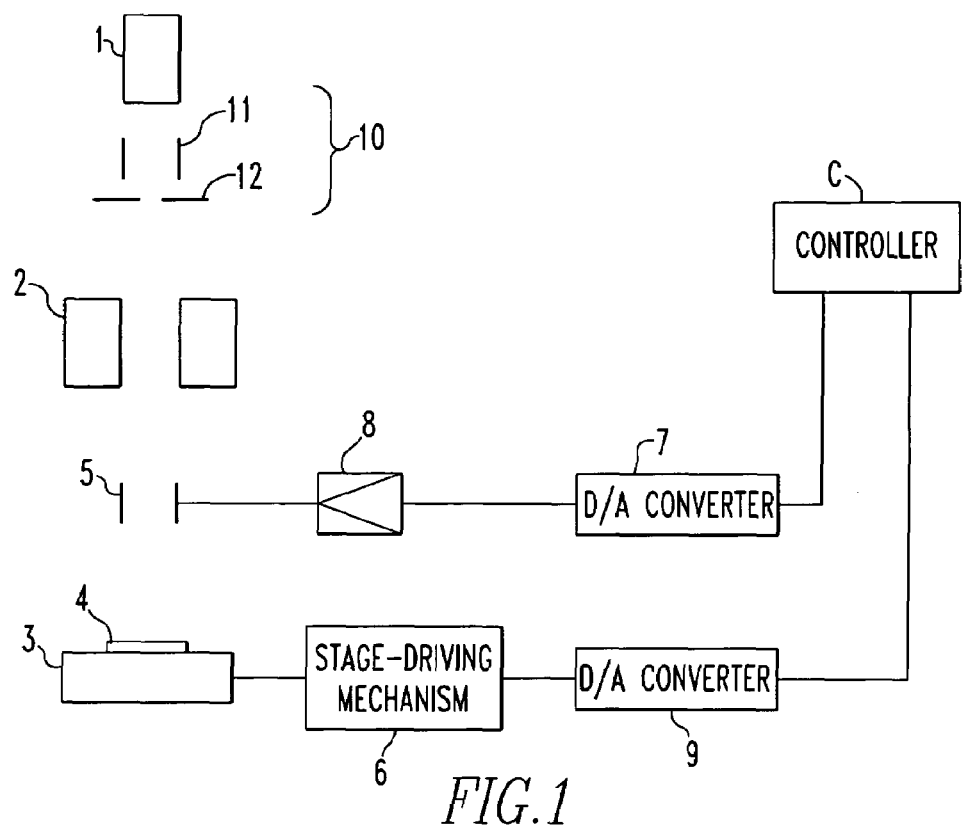
FIG. 1 is a schematic electron-beam lithography system according to one embodiment of the present invention.
Figure 2:
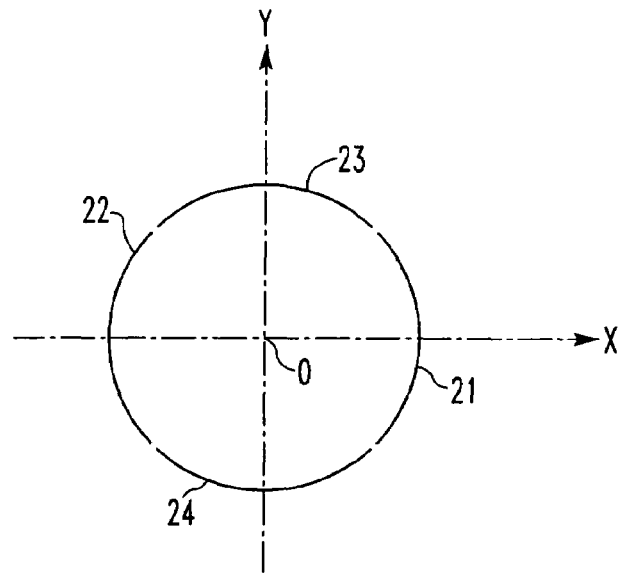
FIG. 2 is a cross-sectional view of an electrostatic quadrupole deflector.
Figure 3:
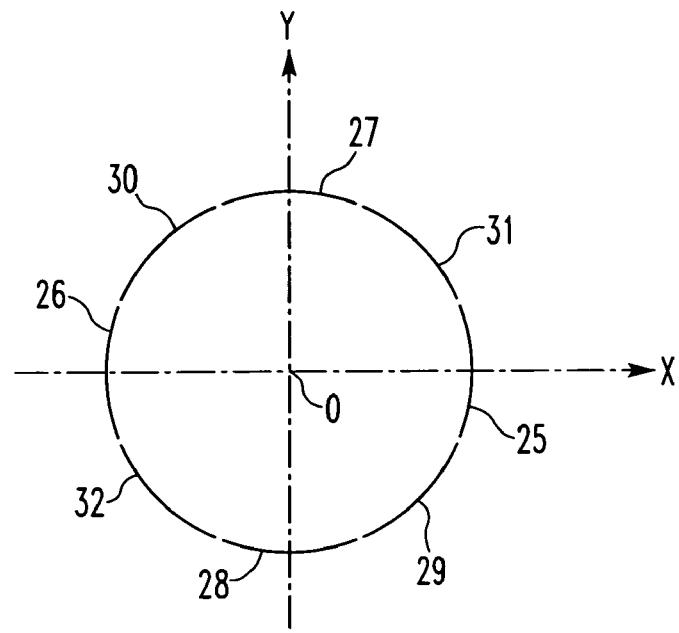
FIG. 3 is a cross-sectional view of an electrostatic octopole deflector.
Figure 4:
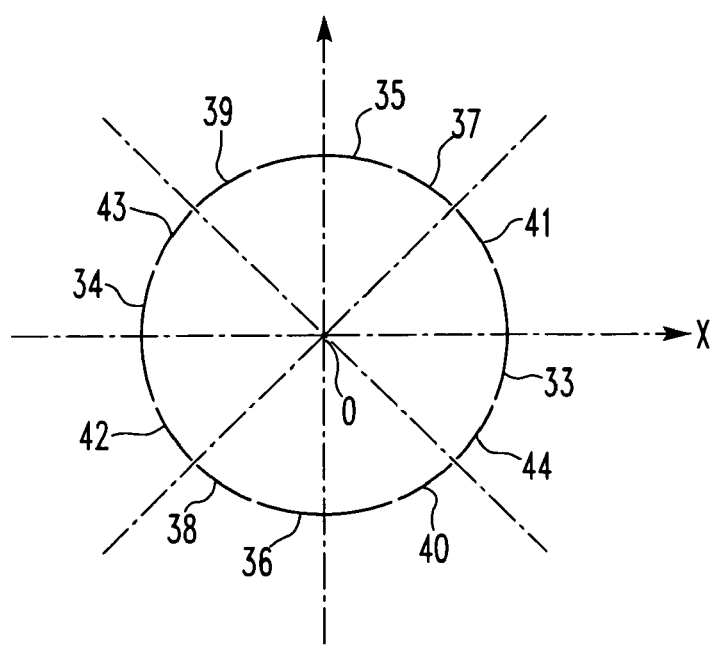
FIG. 4 is a cross-sectional view of an electrostatic deflector made up of (4+8m) electrodes (m=1, 2, 3, . . . )
Figure 5:
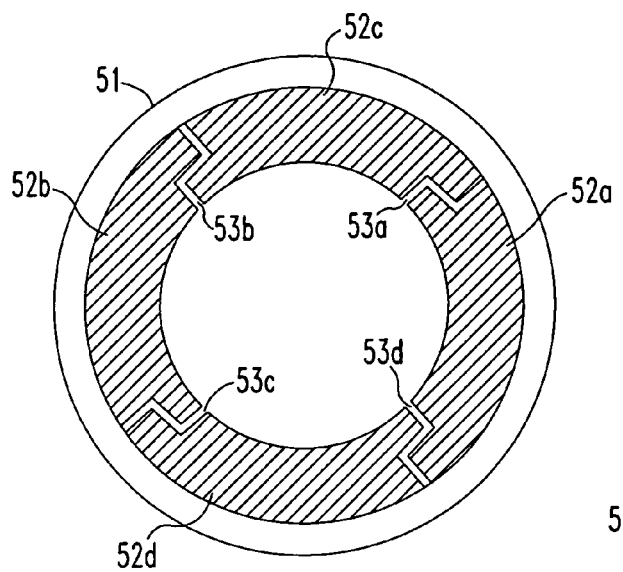
FIG. 5 is a cross-sectional view of an electrostatic deflector antistatically treated by a conventional method.
Figure 6:
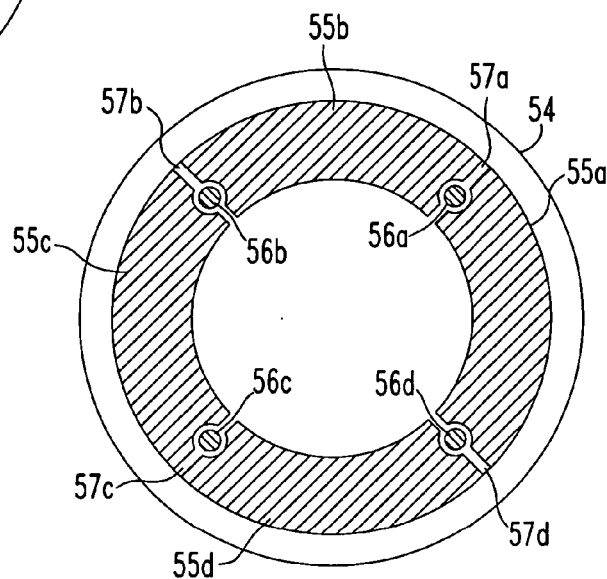
FIG. 6 is a cross-sectional view of an electrostatic deflector antistatically treated by another conventional method.
Figure 7:
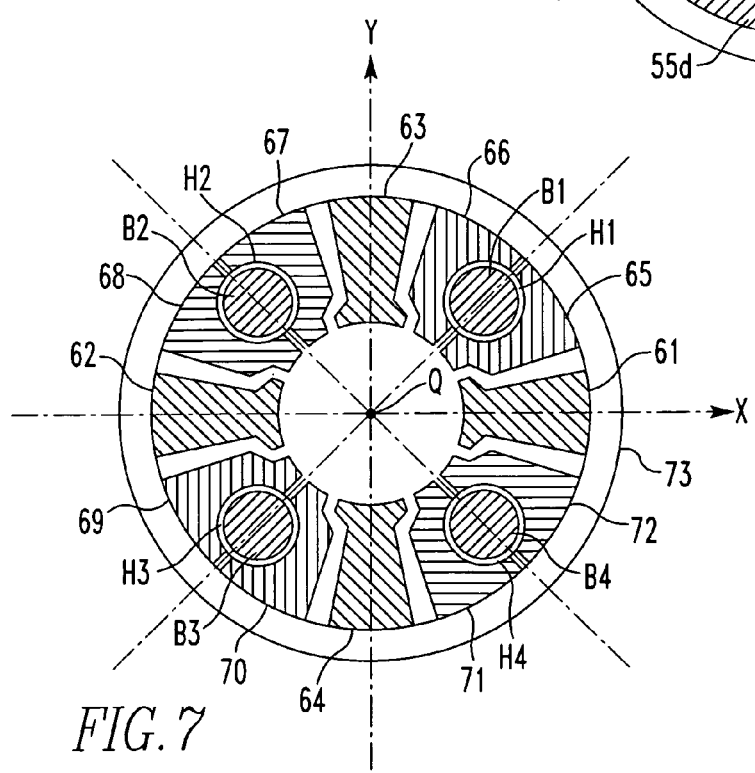
FIG. 7 is a schematic cross-sectional view of an electrostatic deflector according to one embodiment of the present invention.

FIG. 7 schematically shows an electrostatic deflector according to an embodiment of the present invention. This system has (4+8m) electrodes (m=1, 2, 3, . . . ). FIG. 7 shows a cross section of the deflector in which m=1, i.e., the number of poles is 12.

The 12 electrodes include four pillar-like electrodes 61, 62, 63, and 64 which are identical in shape and size. In addition, the 12 electrodes include eight pillar-like electrodes 65, 66, 67, 68, 69, 70, 71, and 72 which are identical in shape and size. The 12 electrodes 61-72 are arranged on the same circumference such that the electrodes together assume a cylindrical form. The alternate ones of the electrodes 61, 66, 67, 62, 70, and 71 act as X-direction deflection electrodes. The other alternate electrodes 63, 68, 69, 64, 72, and 65 act as Y-direction deflection electrodes.

The electrodes 61 and 62 are disposed opposite to a first vertical plane including the Y-axis. The electrodes 63 and 64 are disposed opposite to a second vertical plane including the X-axis. These electrodes 61-64 have front-end portions on the side of the center axis Q of the deflector. Each of these front-end portions is shaped convexly and protrudes to both sides in the circumferential direction. The former electrodes 61 and 62 are shaped symmetrically with respect to the vertical plane including the Y-axis. The latter electrodes 63 and 64 are shaped symmetrically with respect to the vertical plane including the X-axis.

The two electrodes 65 and 66 are mounted between the electrodes 61 and 63 of the four electrodes 61-64 via spaces. The two electrodes 67 and 68 are mounted between the electrodes 63 and 62 via spaces. The two electrodes 69 and 70 are mounted between the electrodes 62 and 64 via spaces. The two electrodes 71 and 72 are mounted between the electrodes 64 and 61 via spaces. Of these electrodes, the electrodes 65 and 66 are symmetrical with respect to a vertical plane which includes a rightwardly tilted axis spaced from the X-axis by 45° in a counterclockwise direction (+direction). Similarly, the electrodes 69 and 70 are symmetrical with respect to this vertical plane. The electrodes 67 and 68 are symmetrical with respect to a vertical plane which includes a leftwardly tilted axis spaced from the X-axis by 45° in a clockwise direction (−direction). Similarly, the electrodes 71 and 72 are symmetrical with respect to this vertical plane.

A hole H1 is formed across the gap produced between the two electrodes 65 and 66 and extends the same distance into each of the electrodes 65 and 66. Holes H2, H3, and H4 are similarly formed across the gaps produced between the two electrodes 67 and 68, between the two electrodes 69 and 70, and between the two electrodes 71 and 72, respectively, and extend the same distance into each of the two electrodes. Conductive rod-like members B1, B2, B3, and B4 having a diameter considerably larger than the width of the original gaps are inserted in the holes H1, H2, H3, and H4, respectively, such that the rod-like members do not touch the hole walls.

The electrodes 65-72 have front-end portions on the side of the center axis Q of the deflector. These front-end portions are shaped concavely along the convex portions of the electrodes 61, 63, 62, and 64 via spaces, i.e., the front-end portions of each electrode pair are recessed circumferentially on both sides. Accordingly, the gaps between the four electrodes 61, 62, 63, 64 and their respective adjacent electrodes 65, 72, 68, 69, 66, 67, 70, and 71 are bent at the locations of the front-end portions. As described previously, the two electrodes 61 and 62 are arranged symmetrically with respect to the vertical plane including the Y-axis. The two electrodes 63 and 64 are arranged symmetrically with respect to the vertical plane including the X-axis. The electrodes 65 and 72 are located adjacent to the electrode 61. The electrodes 68 and 69 are located adjacent to the electrode 62. The electrodes 66 and 67 are located adjacent to the electrode 63. The electrodes 70 and 71 are located adjacent to the electrode 64.

Because of the structure described so far, the deflector itself is symmetrical with respect to (i) the first vertical plane including the X-axis, (ii) the second vertical plane including the Y-axis, (iii) the third vertical plane including the axis located in the angular position spaced from the X-axis by +45°, and (iv) the fourth vertical plane including the axis located in the angular position spaced from the X-axis by −45°.

The outer peripheries of all the electrodes 61-72 are held to the inner wall surface of a cylindrical electrode support body 73 made of an insulating material. Thus, all the electrodes 61-72 are held to the insulative cylindrical electrode support body 73.

The electrostatic deflector of the construction described so far is used, for example, as a deflector for a charged-particle beam system for an electron-beam lithography system. A voltage +Vx is applied to the X-direction deflection electrodes 61, 66, and 71. A voltage −Vx is applied to the X-direction deflection electrodes 62, 70, and 67 located opposite to those electrodes 61, 66, and 71. A voltage +Vy is applied to the Y-direction deflection electrodes 63, 68, and 65. A voltage −Vy is applied to the Y-direction deflection electrodes 64, 72, and 69 located opposite to those Y-direction deflection electrodes. Thus, the symmetry of the electrodes of each pair in the electrostatic deflector is maintained. Consequently, higher-order components of the potential distribution within the deflector which would normally cause aberrations are removed.

Furthermore, the holes are formed only across the gaps between the electrodes 65 and 66, between the electrodes 67 and 68, between the electrodes 69 and 70, and between the electrodes 71 and 72 such that each hole extends into the respective two electrodes. The electrodes 65 and 66 are disposed on the opposite sides of the vertical plane including the axis spaced from the X-axis by 45°. The electrodes 67 and 68 are disposed on the opposite sides of the vertical plane including the axis spaced from the X-axis by −45°. The electrodes 69 and 70 are disposed on the opposite sides of the vertical plane including the axis spaced from the X-axis by 45°. The electrodes 71 and 72 are disposed on the opposite sides of the vertical plane including the axis spaced from the X-axis by −45°. The rod-like members are inserted in the holes, respectively. The bent portions are formed in the other interelectrode spaces. Consequently, it is not necessary to greatly increase the circumferential thickness of each electrode. Increase in size of the electrostatic deflector can be avoided.

In the above embodiment, the electrostatic deflector consisting of (4+8m) electrodes (m=1, 2, 3, . . . ) satisfies the equation m=1, i.e., the number of poles is 12. Of course, the same principle can be applied to an electrostatic deflector with m other than unity (i.e., m=2, 3, . . . ).

Obviously, the present invention is not limited to the structure already described in connection with FIG. 7. In the above embodiment, both circumferential side surfaces of each one electrode pair of the four electrodes 61, 62, 63, and 64 are partially formed convexly. Spaces are held with the side surfaces of the electrodes opposite to the convex portions. The recessed portions are formed along the convex portions. Alternatively, both circumferential side surfaces of each one electrode pair of the four electrodes may be partially formed concavely. Spaces may be held with the side surfaces of the electrodes opposite to the recessed portions. Convex portions may be formed along the concave portions.

Having thus described my invention with the detail and particularity required by the Patent Laws, what is desired protected by Letters Patent is set forth in the following claims.

The invention claimed is:

1. An electrostatic deflector comprising:
a cylindrical support body made of an insulating material;
two pillar-like first electrodes disposed opposite to a first vertical plane including an X-axis;
two pillar-like second electrodes disposed opposite to a second vertical plane including a Y-axis;
8m pillar-like third electrodes (m=1, 2, 3, . . . ) arranged such that an even number out of the third electrodes are disposed between each one interelectrode space between the four electrodes consisting of the first and second electrodes adjacent pairs of third electrodes defining holes therebetween;
holes; and
rod-like members mounted in the holes such that the rod-like members are not in contact with any of the electrodes;
wherein the (4+8m) electrodes consisting of the first, second, and third electrodes are arranged on the same circumference with gaps therebetween such that a cylindrical form supported by the support body is formed by all of the (4+8m) electrodes;
wherein the first and second electrodes are identical in shape and size;
wherein the even number of third electrodes are identical in shape and size;

wherein alternate ones of the electrodes are used as X-direction deflection electrodes;

wherein the remaining ones of the electrodes are used as Y-direction deflection electrodes;

wherein spaces formed on both sides of each one of said first electrodes have bent portions that are symmetrical with respect to the first vertical plane;

wherein spaces formed on both sides of each one of said second electrodes have bent portions that are symmetrical with respect to the second vertical plane;

wherein some of said third electrodes are arranged symmetrically with respect to a third vertical plane including an axis located in an angular position spaced from the X-axis by 45°;

wherein the remaining ones of said third electrodes are arranged symmetrically with respect to a fourth vertical plane including an axis located in an angular position spaced from the X-axis by −45°;

wherein said holes are formed each across the third or fourth vertical plane and extend the same distance into each of the two electrodes located adjacent to the third or fourth vertical plane; and wherein the deflector itself constituted by the electrodes, the spaces, the rod-like members, and the support body is symmetrical with respect to said first, second, third, and fourth vertical planes.

2. The electrostatic deflector of claim 1, wherein said cylindrical form is a hollow cylindrical form.

3. The electrostatic deflector of claim 1, wherein both circumferential side surfaces of each one of the four electrodes consisting of the first and second electrodes are partially formed convexly, and wherein side surfaces of the electrodes opposite to the convexly formed side surfaces are formed concavely along the convex portions with spaces therebetween.

4. The electrostatic deflector of claim 1, wherein both circumferential side surfaces of each one of the four electrodes consisting of the first and second electrodes are partially formed concavely, and wherein side surfaces of the electrodes opposite to the concavely formed side surfaces are formed convexly along the concave portions with spaces therebetween.

* * * * *